(12) United States Patent
Hoenigschmid

(10) Patent No.: US 8,072,792 B2
(45) Date of Patent: Dec. 6, 2011

(54) INTEGRATED CIRCUIT WITH RESISTIVE MEMORY CELLS AND METHOD FOR MANUFACTURING SAME

(75) Inventor: Heinz Hoenigschmid, Poecking (DE)

(73) Assignee: Qimonda AG, Munich (DE)

( * ) Notice: Subject to any disclaimer, the term of this patent is extended or adjusted under 35 U.S.C. 154(b) by 779 days.

(21) Appl. No.: 12/031,955

(22) Filed: Feb. 15, 2008

(65) Prior Publication Data

US 2009/0207646 A1     Aug. 20, 2009

(51) Int. Cl.
*G11C 11/00* (2006.01)

(52) U.S. Cl. .......................................... 365/148; 365/63

(58) Field of Classification Search .................. 365/148, 365/100, 63; 257/259, E33.012
See application file for complete search history.

(56) References Cited

U.S. PATENT DOCUMENTS

| | | | | |
|---|---|---|---|---|
| 6,757,187 B2 * | 6/2004 | Hoenigschmid | .............. | 365/158 |
| 6,826,076 B2 * | 11/2004 | Asano et al. | ................... | 365/158 |
| 6,982,899 B2 * | 1/2006 | Sumitani et al. | ............... | 365/154 |
| 6,990,004 B2 * | 1/2006 | Iwata | ............................... | 365/63 |
| 2004/0001358 A1 * | 1/2004 | Nahas et al. | ............. | 365/185.18 |
| 2006/0050547 A1 * | 3/2006 | Liaw et al. | ..................... | 365/148 |
| 2006/0067103 A1 * | 3/2006 | Ferrant et al. | ................. | 365/148 |
| 2007/0211513 A1 * | 9/2007 | Liaw et al. | ..................... | 365/148 |

* cited by examiner

*Primary Examiner* — VanThu Nguyen
*Assistant Examiner* — Douglas King
(74) *Attorney, Agent, or Firm* — Patterson & Sheridan, LLP

(57) ABSTRACT

An integrated circuit including a resistive memory cell and a method of manufacturing the integrated circuit are described. The integrated circuit comprises a plurality of resistive memory cells and a plurality of voltage supply contacts, wherein at least four resistive memory cells are in signal connection with one voltage supply contact.

15 Claims, 4 Drawing Sheets

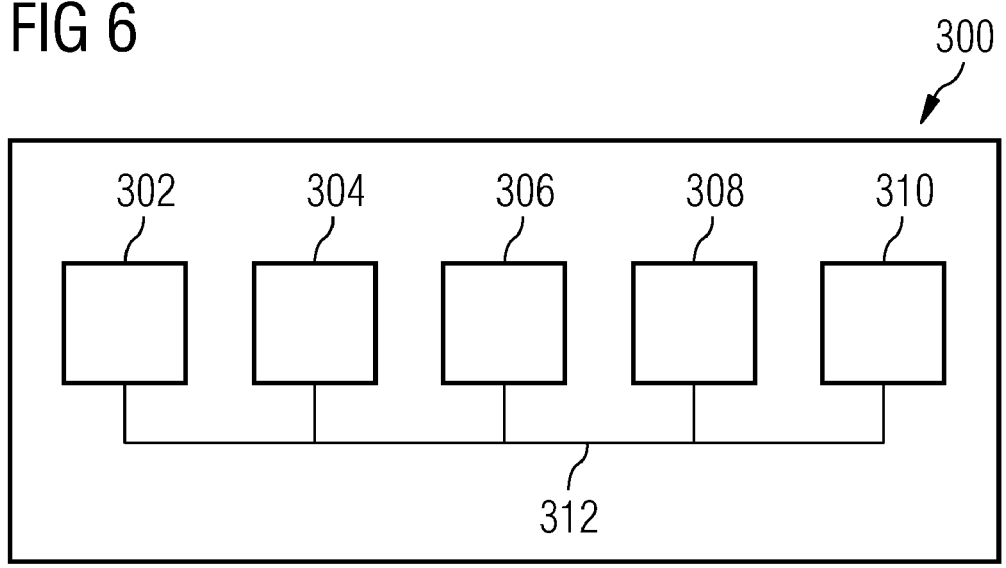

US 8,072,792 B2

INTEGRATED CIRCUIT WITH RESISTIVE MEMORY CELLS AND METHOD FOR MANUFACTURING SAME

BACKGROUND OF THE INVENTION

Resistive memories make use of a memory element that can change its electrical resistance through suitable programming. Accordingly, the memory element comprises a resistive storage medium that exhibits at least two different states having different electrical resistance. One of theses states may be a high resistive state and the other may be a low resistive state. The resistive storage medium may be switched between theses states through suitable programming.

In resistive memory cells, such as conductive bridge RAM (CBRAM) memory cells, also referred to as programmable metallization cells (PMC) as well as phase change RAM (PCRAM) memory cells, or magnetic RAM (MRAM) cells, for example, the logical information may be written into a memory cell by changing the resistance of the cell. Storage of the information may be achieved by maintaining the resistance of the cell. For evaluating the content of a memory cell the resistance value of the cell may be evaluated by applying a voltage or a current to the cell, for example.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 6 shows a schematic view of a computing system according to one embodiment.

DETAILED DESCRIPTION OF THE PREFERRED EMBODIMENT

Figure 1:
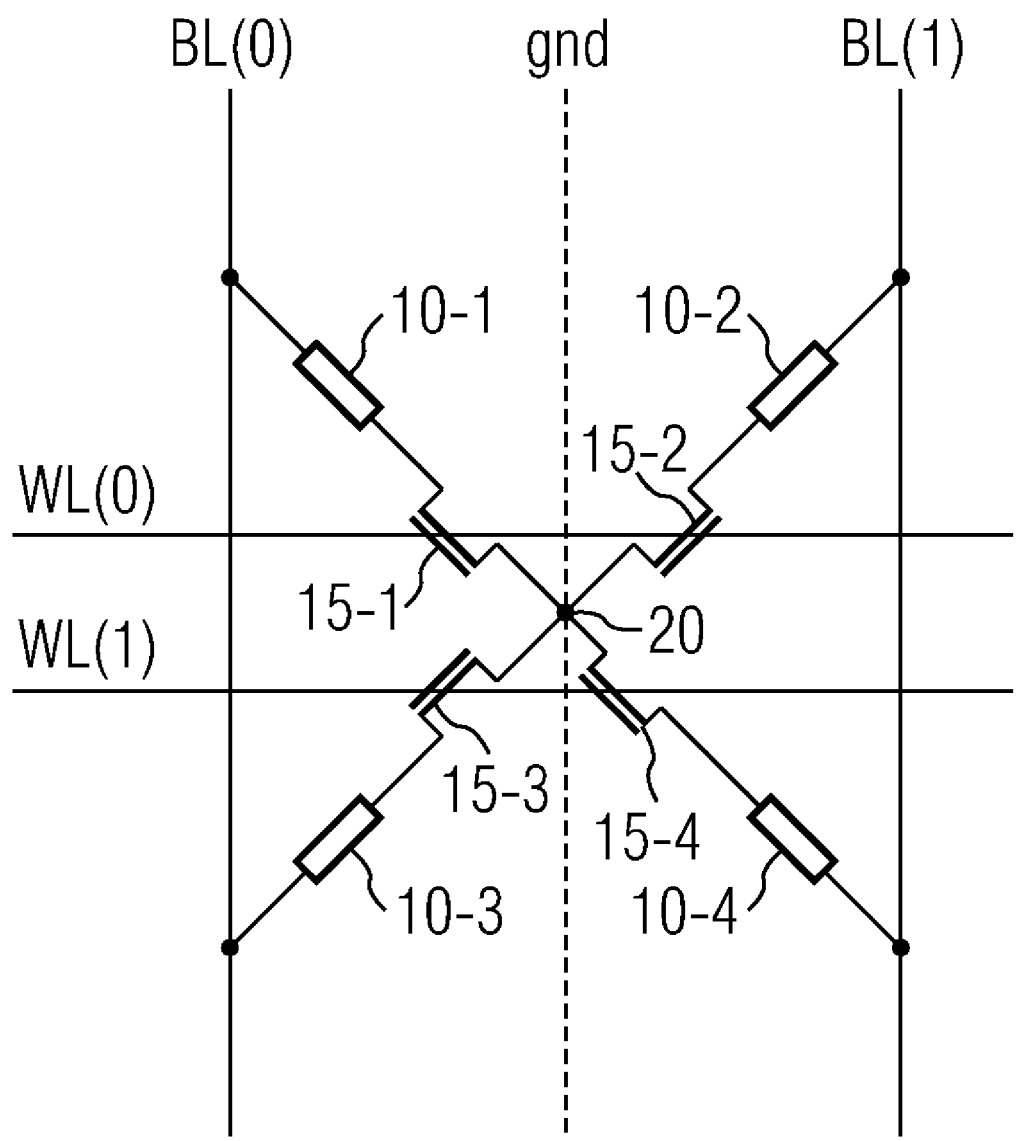
FIG. 1 shows a partial schematic view of an integrated circuit according to an embodiment.

This description is directed generally to an integrated circuit comprising resistive memory cells.

Details of one or more implementations are set forth in the accompanying exemplary drawings and exemplary description below. Other features will be apparent from the description and drawings, and from the claims.

According to one embodiment, an integrated circuit may comprise a plurality of voltage supply contacts, a plurality of resistive memory cells, each comprising a resistive memory element and an active area by means of which the resistive memory element may be brought into signal connection with a voltage supply contact, and a plurality of wordlines and a plurality of bitlines adapted to select a predetermined resistive memory cell. Moreover, at least four resistive memory cells may be in signal connection with one voltage supply contact. Furthermore, of said at least four resistive memory cells two resistive memory elements may be arranged above or under one bitline and two other resistive memory elements may be arranged above or under another bitline.

In one embodiment, the memory elements of the at least four resistive memory cells may all be arranged above the respective bitline. In another embodiment, the memory elements of the at least four resistive memory cells may all be arranged under the respective bitline. In yet another embodiment, some of the memory elements of the at least four resistive memory cells may be arranged above the respective bitline, while other memory elements of the at least four resistive memory cells may be arranged under the respective bitline. For example, of said at least four resistive memory cells, two resistive memory elements may be arranged above one bitline and two other resistive memory elements may be arranged under another bitline. The memory elements may be arranged directly or indirectly above or under the respective bitline, i.e. the memory elements may be arranged adjacent to the respective bitline or at a distance above or under the respective bitline with one or more layers or an additional material being arranged between the memory elements and the respective bitline.

In addition of said at least four resistive memory cells, two active areas may be arranged above or under one wordline and two other active areas may be arranged above or under another wordline. In one embodiment, the active areas of the at least four resistive memory cells may all be arranged above the respective wordline. In another embodiment, the active areas of the at least four resistive memory cells may all be arranged under the respective wordline. In yet another embodiment, some of the active areas of the at least four resistive memory cells may be arranged above the respective wordline, while other active areas of the at least four resistive memory cells may be arranged under the respective wordline. For example, of said at least four active areas, two active areas may be arranged above one wordline and two other active areas may be arranged under another wordline. The active areas may be arranged directly or indirectly above or under the respective wordline, i.e. the active areas may be arranged adjacent to the respective wordline or at a distance above or under the respective wordline with one or more layers or an additional material being arranged between the active areas and the respective wordline.

According to another embodiment an integrated circuit may comprise a first and second bit line, a voltage supply contact, and a first, second, third, and fourth resistive memory cell, said first, second, third, and fourth resistive memory cells may respectively comprise a first, second, third, and fourth resistive memory element and a first, second, third, and fourth active area. Said first, second, third, and fourth resistive memory cells may be connected with said voltage supply contact. Moreover, said first and third resistive memory elements may be arranged above or under said first bitline and said second and fourth resistive memory elements may be arranged above or under said second bitline. Furthermore, said first and second active areas may be arranged above or under said first wordline and said third and fourth active areas may be arranged above or under said second wordline.

FIG. 1 shows a partial schematic view of an integrated circuit according to an embodiment. In the shown example, two substantially parallel bitlines BL(0) (first bitline) and BL(1) (second bitline) may be provided. Between the two bitlines BL(0) and BL(1) there may be provided a line which bears a predetermined potential. Said predetermined potential may in one example be the ground potential gnd.

Perpendicularly with the bitlines BL(0) and BL(1), there may be provided two substantially parallel wordlines WL(0) (first wordline) and WL(1) (second wordline). On or above or under the line bearing the ground potential gnd there may be provided a voltage supply contact 20, which may be provided between the two parallel wordlines WL(0) and WL(1).

A resistive memory element 10-1 may be connected with bitline BL(0). Resistive memory element 10-1 may be connected with the voltage supply contact 20 via a transistor 15-1. In the present example said transistor 15-1 may be an active area 15-1. Active area 15-1 can be addressed or driven by wordline WL(0). Resistive element 10-1 and active area 15-1 together may form a resistive memory cell.

A corresponding arrangement may also be provided between bitline B(1) being addressable via wordline WL(0) to voltage supply contact 20 (resistive memory element 10-2, active area 15-2). Furthermore, there may be provided respective arrangements of resistive memory elements 10-3, 10-4, which may be contacted with the voltage supply contact 20 via active areas 15-3, 15-4, respectively, said active areas 15-3, 15-4 being addressable via wordline WL(1). Thus, four resistive memory cells (first to fourth resistive memory cell) may be connected with the voltage supply contact 20. More in detail, four resistive memory elements 10-1 (first resistive memory element), 10-2 (second resistive memory element), 10-3 (third resistive memory element), 10-4 (fourth resistive memory element) may be connected with the voltage supply contact 20 via active areas 15-1 (first active area), 15-2 (second active area), 15-3 (third active area), 15-4 (fourth active area), respectively.

A plurality of parallel bitlines and a plurality of parallel wordlines may be provided, and the arrangement described above may be provided above or under a plurality of these bitlines and the wordlines parallel thereto.

The following two embodiments, with respect to embodiment described above, will be described in terms of the layout of the integrated circuit.

A first embodiment will be described with reference to FIG. 2.

Figure 2:
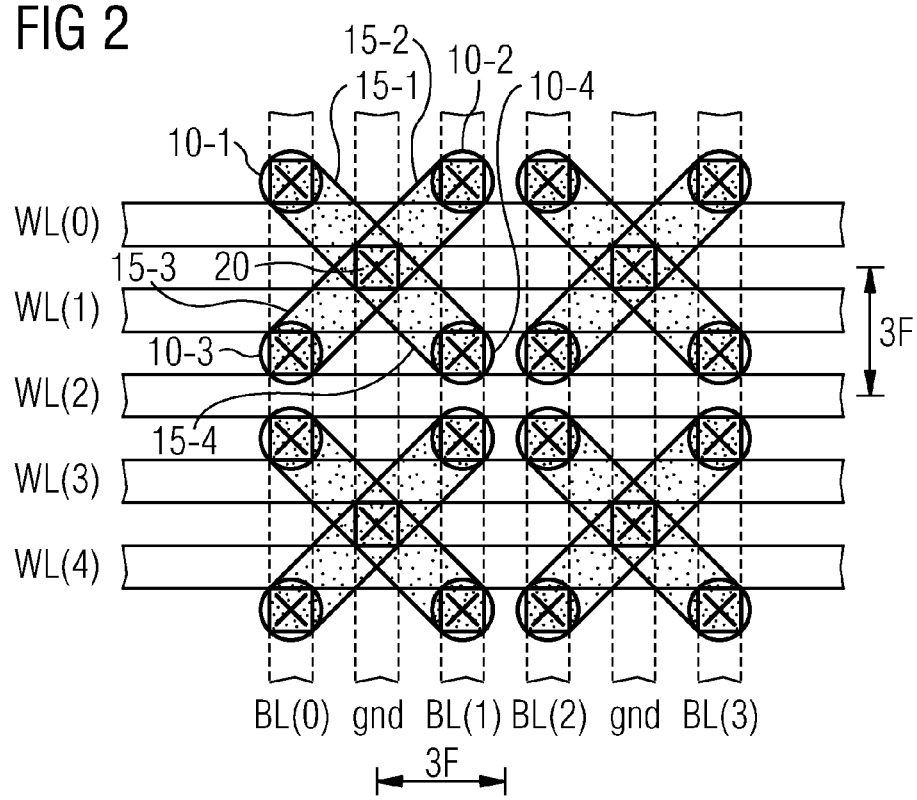
FIG. 2 shows a partial view of a layout of an integrated circuit according to an embodiment.

In FIG. 2, a plurality of parallel bitlines BL(0)-BL(3) is shown. Between bitlines BL(0) and BL(1) and bitline BL(2) and BL(3), there may be respectively provided a line which bears the ground potential gnd. Moreover, there are provided wordlines WL(0) to WL(4) perpendicular thereto. Contacted with bitline BL(0), there may be provided a resistive memory element 10-1. Also connected with bitline BL(0), there may be provided a resistive memory element 10-3. These two resistive memory elements 10-1 and 10-3 are provided as a pair above or under bitline BL(0). Correspondingly, above or under bitline BL(1) there are provided resistive memory elements 10-2 and 10-4.

On the line provided between bitlines BL(0) and BL(1), said line bearing the ground potential gnd, there may be provided a voltage supply contact 20. The resistive memory elements 10-1 to 10-4 may be connected with the voltage supply contact 20 via active areas 10-1 to 10-4. The active areas 15-1 and 15-2 are addressable via wordline WL(0) and active areas 15-3 and 15-4 are addressable via wordline WL(1).

In the present embodiment, active areas 15-1 to 15-4 are provided in an angle different from 90° with respect to the parallel wordlines WL. Active areas may be provided in an angle of 45° with respect to the wordlines WL or substantially diagonal with respect to wordlines WL and bitlines BL. The group of resistive memory elements 10-1 to 10-4, which are connected with the voltage supply contact 20 via active areas 15-1 to 15-4 thus substantially forms the shape of an "X" in this representation. A respective arrangement of resistive memory elements, active areas and voltage supply contact may also be provided between bitlines BL(2) and BL(3) and wordlines WL(0) and WL(1). It is to be noted, that between bitlines BL(1) and BL(2) there does not need to be provided an additional line as e.g. a line bearing the ground potential gnd.

Furthermore, there may be provided a corresponding arrangement in which the active areas may be addressed via wordlines WL(3) and WL(4). Moreover, there may be provided a wordline WL(2), which may be located between wordlines WL(1) and WL(3). This wordline WL(2) does not need to be used for addressing active areas and may be called "dummy wordline".

Thus, in the above example there are respectively connected four resistive memory elements via respective active areas with one associated voltage supply contact.

By means of the arrangement described above, the area required for a respective arrangement of four memory cells and the associated voltage supply contact may be limited to $3F \times 3F = 9F^2$, with F being the minimal producible structure size for the respective integrated circuit. Thus, the area needed for the integrated circuit can be reduced and/or more resistive memory cells may be arranged on the same area. This may be of interest, as the area available for integrated circuits is constantly being reduced.

Figure 3:
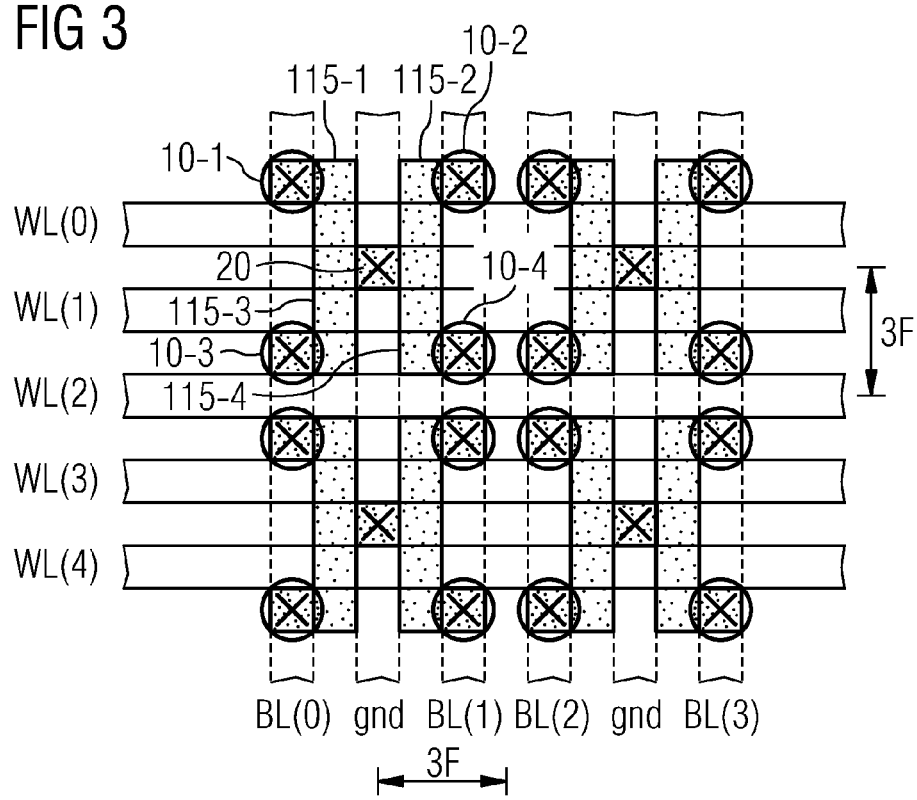
FIG. 3 shows a partial view of a layout of an integrated circuit according to another embodiment.

A further embodiment will be described with reference to FIG. 3. The arrangement of this embodiment basically corresponds to the one described with reference to FIG. 2. Therefore in the following only the differences between the two embodiments will be discussed.

In this embodiment, the active areas 115-1 to 115-4 contacting resistive memory elements 10-1 to 10-4 with voltage supply contact 20 may be provided substantially parallel with bitlines BL and perpendicular to wordlines WL. Thus, each group of four memory cells 10-1 to 10-4, the corresponding active areas 115-1 to 115-4, and the corresponding voltage supply contact 20 may form the shape of an "H".

In a further embodiment, it may be provided, that there are provided two planes on which resistive memory cells may be arranged. Here it may be provided that respectively four resistive memory cells are provided per plane and these eight resistive memory elements may be contacted with one voltage supply contact via active areas. This arrangement may be called a stacked arrangement.

Moreover, it may be provided that between a group of four respective memory cells there is not provided a dummy wordline.

In the above described embodiments, a voltage supply contact may bear the ground potential gnd. In connection with this the integrated circuit may be provided a PCRAM (phase change RAM) or MRAM (magneto-resistive RAM). Alternatively, it may be provided that the voltage supply contact lies on a predetermined mid potential. This may be the case when the integrated circuit is provided as CBRAM (conductive bridge RAM).

Moreover, it may be provided that the potential of the voltage supply contact is constant. Alternatively, the potential of the voltage supply contact may be alterable. In this respect, the alterable potential may be a pulsed potential.

According to a further embodiment of the invention, a method of manufacturing an integrated circuit may comprise providing a plurality of voltage supply contacts, providing a plurality of resistive memory cells, each comprising a resistive memory element and an active area by means of which the resistive memory element may be brought into signal connection with a voltage supply contact, and providing a plurality of wordlines and a plurality of bitlines adapted to select a predetermined resistive memory cell. The method may further comprise the step of connecting at least four resistive memory cells with one voltage supply contact. Said step of providing said plurality of resistive memory cells may comprise the steps of arranging two resistive memory elements of said at least four resistive memory cells above or under one bitline and two other resistive memory elements above or under another bitline, and arranging two active areas of said at least four resistive memory cells above or under one wordline and two other active areas above or under another wordline.

Figure 4:
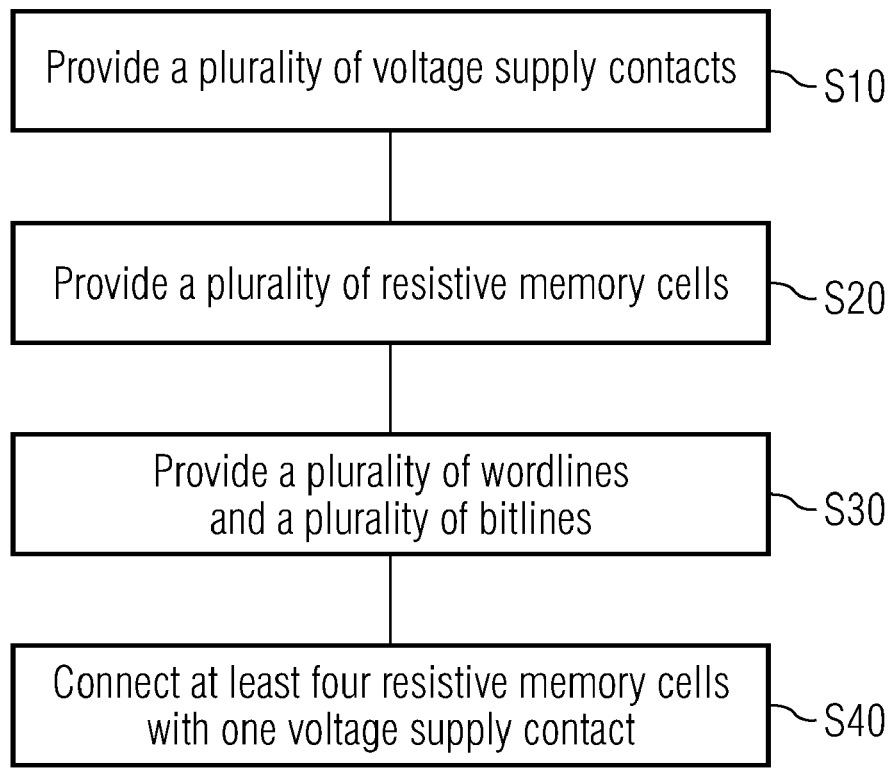
FIG. 4 shows a flow diagram showing the steps of a method of manufacturing an integrated circuit according to one embodiment.
Figure 5:
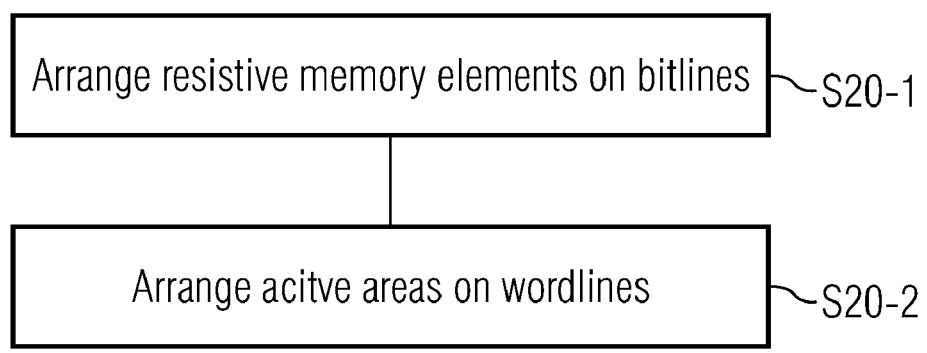
FIG. 5 shows a flow diagram showing details of step S20 of FIG. 4.

The flow diagram of an example of a method of manufacturing an integrated circuit according to an embodiment is shown in FIGS. 4 and 5.

The method of manufacturing may comprise the step of providing a plurality of voltage supply contacts (step S10). Said voltage supply contacts may be arranged as described above.

Furthermore, the method may comprise the step of providing a plurality of resistive memory cells (step S20). In said step of providing a plurality of resistive memory cells, the resistive memory cells may be arranged in a manner as described above. Moreover, for each resistive memory cell, a resistive memory element and an active area as described above may be provided.

The method may also comprise the step of providing a plurality of wordlines and a plurality of bitlines adapted to select a predetermined resistive memory cell (step S30).

In a further step (step S40), at least four resistive memory cells may be contacted with one voltage supply contact.

As shown in FIG. 5, said step of providing said plurality of resistive memory cells (step S20) may comprise the steps of arranging two resistive memory elements of said at least four resistive memory cells, which are to be connected with one voltage supply contact, above or under one bitline and two other resistive memory elements above or under another bitline (step S20-1), and arranging two active areas of said at least four resistive memory cells, which are to be connected with one voltage supply contact, above or under one wordline and two other active areas above or under another wordline (step S20-2).

According to yet a further embodiment, a computing system may comprise an input apparatus, an output apparatus, a processing apparatus, and a memory. Said memory may comprise a plurality of voltage supply contacts, a plurality of resistive memory cells, each comprising a resistive memory element and an active area by means of which the resistive memory element may be brought into signal connection with a voltage supply contact, and a plurality of wordlines and a plurality of bitlines adapted to select a predetermined resistive memory cell. Moreover, at least four resistive memory cells may be in signal connection with one voltage supply contact.

Furthermore, of said at least four resistive memory cells two resistive memory elements may be arranged above or under one bitline and two other resistive memory elements may be arranged above or under another bitline. In addition of said at least four resistive memory cells two active areas may be arranged above or under one wordline and two other active areas may be arranged above or under another wordline.

In accordance with yet a further embodiment, memory devices that include one or more integrated circuits as described herein may be used in a variety of applications or systems, such as the illustrative computing system shown in FIG. 6. The computing system 300 may include a memory device 302, which may include integrated circuits as described herein above. The system may also include a processing apparatus 304, such as a microprocessor or other processing device or controller, as well as input and output apparatus, such as a keypad 306, display 308, and/or wireless communication apparatus 310. The memory device 302, processing apparatus 304, keypad 306, display 308 and wireless communication apparatus 310 are interconnected by a bus 312.

The wireless communication apparatus 310 may have the ability to send and/or receive transmissions over a cellular telephone network, a WiFi wireless network, or other wireless communication network. It will be understood that the various input/output devices shown in FIG. 6 are merely examples. Memory devices including integrated circuits of embodiments of the invention may be used in a variety of systems. Alternative systems may include a variety input and output devices, multiple processors or processing apparatus, alternative bus configurations, and many other configurations of a computing system. Such systems may be configured for general use, or for special purposes, such as cellular or wireless communication, photography, playing music or other digital media, or any other purpose now known or later conceived to which an electronic device or computing system including memory may be applied.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An integrated circuit, comprising:
a plurality of voltage supply contacts;
a plurality of resistive memory cells, each comprising a resistive memory element and an active area by means of which the resistive memory element may be brought into signal connection with a voltage supply contact; and
a plurality of wordlines and a plurality of bitlines adapted to select a predetermined resistive memory cell, wherein at least four resistive memory cells are in signal connection with a given one of the plurality of voltage supply contacts, wherein of said at least four resistive memory cells, two resistive memory elements are arranged above or under one bitline and two other resistive memory elements are arranged above or under another bitline, and wherein of said at least four resistive memory cells, two active areas are arranged above or under one wordline and two other active areas are arranged above or under another wordline,
wherein a direction of a current that flows in each active area is at an angle other than 90° with respect to an orientation of the plurality of wordlines.

2. The integrated circuit according to claim 1, wherein the four resistive memory elements, the respective voltage supply contact and the active areas connecting the resistive memory elements and the associated voltage supply contact substantially form the shape of an X.

3. The integrated circuit according to claim 2, wherein said active area, which respectively connects one resistive memory element and the associated voltage supply contact, is provided in an angle of substantially 45° with respect to said wordline.

4. The integrated circuit according to claim 1, wherein between two adjacent groups of resistive memory elements, the associated voltage supply contact and active areas connecting the resistive memory elements and the associated voltage supply contact there is respectively provided an unused wordline.

5. The integrated circuit according to claim 1, wherein the supply voltage provided at the voltage supply contact is constant.

6. The integrated circuit according to claim 1, wherein the supply voltage provided at the voltage supply contact is pulsed.

7. The integrated circuit according to claim 1, wherein resistive memory cells are arranged on a first plane and a second plane, and resistive memory cells which are arranged on the first and second planes are in signal connection with one voltage supply contact, the first plane having a first direction parallel to a direction of a first current that flows in a first active area disposed on the first plane and the second plane having a second direction parallel to a direction of a second current that flows in a second active area disposed on the second plane, wherein the first and second directions are non-parallel relative to each other.

8. The integrated circuit according to claim 1, wherein the voltage supply contact bear the ground potential.

9. A method of manufacturing an integrated circuit, comprising:
providing a plurality of voltage supply contacts;
providing a plurality of resistive memory cells, each comprising a resistive memory element and an active area by means of which the resistive memory element may be brought into signal connection with a voltage supply contact;
providing a plurality of wordlines and a plurality of bitlines adapted to select a predetermined resistive memory cell; and
connecting at least four resistive memory cells with one voltage supply contact and; wherein said providing said plurality of resistive memory cells comprises:
arranging two resistive memory elements of said at least four resistive memory cells above or under one bitline and two other resistive memory elements above or under another bitline, and
arranging two active areas of said at least four resistive memory cells above or under one wordline and two other active areas above or under another wordline, wherein a direction of a current that flows in each active area is at an angle other than 90° with respect to an orientation of the plurality of wordlines.

10. The method according to claim 9, wherein the four resistive memory elements, the respective voltage supply contact and the active areas connecting the resistive memory elements and the associated voltage supply contact substantially form the shape of an X.

11. A computing system, comprising:
an input apparatus;
an output apparatus;
a processing apparatus; and
a memory, said memory, comprising:
a plurality of voltage supply contacts;
a plurality of resistive memory cells, each comprising a resistive memory element and an active area by means of which the resistive memory element may be brought into signal connection with a voltage supply contact; and
a plurality of wordlines and a plurality of bitlines adapted to select a predetermined resistive memory cell, wherein at least four resistive memory cells are in signal connection with one voltage supply contact,
wherein of said at least four resistive memory cells two resistive memory elements are arranged above or under one bitline and two other resistive memory elements are arranged above or under another bitline, and wherein of said at least four resistive memory cells two active areas are arranged above or under one wordline and two other active areas are arranged above or under another wordline, and
wherein a direction of a current that flows in each active area is at an angle other than 90° with respect to an orientation of the plurality of wordlines.

12. The computing system according to claim 11, wherein the four resistive memory elements, the respective voltage supply contact and the active areas connecting the resistive memory elements and the associated voltage supply contact substantially form the shape of an X.

13. The computing system according to claim 12, wherein said active area, which respectively connects one resistive memory element and the associated voltage supply contact, is provided in an angle of substantially 45° with respect to said wordline.

14. An integrated circuit, comprising:
a first and second bit line;
a first and second wordline;
a voltage supply contact;
a first, second, third, and fourth resistive memory cell, said first, second, third, and fourth resistive memory cells respectively comprising a first, second, third, and fourth resistive memory element and a first, second, third, and fourth active area,
wherein said first, second, third, and fourth resistive memory cells are connected with said voltage supply contact,
wherein said first and third resistive memory elements are arranged above or under said first bitline and said second and fourth resistive memory elements are arranged above or under said second bitline; and
wherein said first and second active areas are arranged above or under said first wordline and said third and fourth active areas are arranged above or under said second wordline, and
wherein a direction of a current that flows in each active area is at an angle other than 90° with respect to an orientation of the first and second wordlines.

15. The integrated circuit according to claim 14, wherein the four resistive memory cell and the respective voltage supply contact substantially form the shape of an X.

* * * * *